United States Patent
Li et al.

(10) Patent No.: US 12,040,224 B2
(45) Date of Patent: *Jul. 16, 2024

(54) TRANSISTOR STRUCTURE WITH AIR GAP AND METHOD OF FABRICATING THE SAME

(71) Applicant: UNITED MICROELECTRONICS CORP., Hsin-Chu (TW)

(72) Inventors: Yunfei Li, Singapore (SG); Ji Feng, Singapore (SG); Guohai Zhang, Singapore (SG); Ching Hwa Tey, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 68 days.

This patent is subject to a terminal disclaimer.

(21) Appl. No.: 17/737,011

(22) Filed: May 4, 2022

(65) Prior Publication Data

US 2022/0262671 A1    Aug. 18, 2022

Related U.S. Application Data

(63) Continuation of application No. 17/133,652, filed on Dec. 24, 2020, now Pat. No. 11,355,389.

(30) Foreign Application Priority Data

Nov. 4, 2020   (CN) .......................... 202011214795.8

(51) Int. Cl.
*H01L 21/768* (2006.01)
*H01L 21/02* (2006.01)
(Continued)

(52) U.S. Cl.
CPC .... *H01L 21/7682* (2013.01); *H01L 21/02063* (2013.01); *H01L 21/76805* (2013.01);
(Continued)

(58) Field of Classification Search
CPC .......... H01L 21/7682; H01L 21/02063; H01L 21/76805; H01L 21/76814;
(Continued)

(56) References Cited

U.S. PATENT DOCUMENTS 6,211,057 B1   4/2001  Lin
6,917,109 B2   7/2005  Lur
(Continued)

*Primary Examiner* — Dale E Page
*Assistant Examiner* — Quovaunda Jefferson
(74) *Attorney, Agent, or Firm* — Winston Hsu

(57) ABSTRACT

A transistor structure with an air gap includes a substrate. A transistor is disposed on the substrate. An etching stop layer covers and contacts the transistor and the substrate. A first dielectric layer covers and contacts the etching stop layer. A second dielectric layer covers the first dielectric layer. A trench is disposed on the gate structure and within the first dielectric layer and the second dielectric layer. A width of the trench within the second dielectric layer is smaller than a width of the trench within the first dielectric layer. A filling layer is disposed within the trench and covers the top surface of the second dielectric layer. An air gap is formed within the filling layer.

18 Claims, 6 Drawing Sheets

(51) Int. Cl.
 *H01L 23/532* (2006.01)
 *H01L 23/535* (2006.01)

(52) U.S. Cl.
 CPC .. *H01L 21/76814* (2013.01); *H01L 21/76895* (2013.01); *H01L 23/5329* (2013.01); *H01L 23/535* (2013.01)

(58) Field of Classification Search
 CPC ........... H01L 21/76895; H01L 23/5329; H01L 23/535; H01L 23/53295; H01L 23/5222; H01L 23/5283; H01L 29/7833
 See application file for complete search history.

(56) References Cited

U.S. PATENT DOCUMENTS

| | | | |
|---|---|---|---|
| 6,951,809 B2* | 10/2005 | Tarumi | H01L 21/76804 438/653 |
| 7,303,962 B2 | 12/2007 | Chou | |
| 10,242,933 B2 | 3/2019 | Bonilla | |
| 10,515,876 B1 | 12/2019 | Zhou | |
| 11,205,609 B2 | 12/2021 | Hsu | |
| 11,270,945 B2 | 3/2022 | Chang | |
| 11,355,389 B2* | 6/2022 | Li | H01L 23/53295 |
| 2002/0024150 A1* | 2/2002 | Farrar | H01L 23/5329 257/786 |
| 2004/0266106 A1* | 12/2004 | Lee | H10B 41/00 438/257 |
| 2005/0037605 A1* | 2/2005 | Kim | H01L 21/76808 438/622 |
| 2008/0001237 A1* | 1/2008 | Chang | H01L 21/823857 257/E21.627 |
| 2016/0141240 A1* | 5/2016 | Saka | H01L 29/78 257/288 |

* cited by examiner

TRANSISTOR STRUCTURE WITH AIR GAP AND METHOD OF FABRICATING THE SAME

CROSS REFERENCE TO RELATED APPLICATIONS

This application is a continuation application of U.S. application Ser. No. 17/133,652, filed on Dec. 24, 2020. The content of the application is incorporated herein by reference.

BACKGROUND OF THE INVENTION

1. Field of the Invention

The present invention relates to an air gap and a method of making the same, and more particularly to a method and a structure which has an air gap formed in a trench with a big-end-down shape.

2. Description of the Prior Art

As the integration of semiconductor elements increases, the distance between the elements also shrinks. Because the dielectric layer, such as silicon nitride, covering the transistor has a high dielectric constant, high parasitic capacitance is generated between the gate and the surrounding metal layer. The parasitic capacitance increases power consumption and reduces the performance of the semiconductor chip. Currently, the silicon nitride layer is replaced by materials which have lower dielectric constant such as silicon oxide. However, this method does not reach the requirements for designs smaller than 30 nm process.

Therefore, a material that can provide a lower dielectric constant is needed to replace the traditional dielectric layer.

SUMMARY OF THE INVENTION

According to a preferred embodiment of the present invention, a transistor structure with an air gap includes a substrate. A transistor is disposed on the substrate. The transistor includes a gate structure disposed on the substrate. A source doping region and a drain doping region are respectively embedded in the substrate at two side of the gate structure. The transistor structure with an air gap further includes an etching stop layer covering and contacting the transistor and the substrate. A first dielectric layer covers and contacts the etching stop layer. A second dielectric layer covers the first dielectric layer. A first contact plug is disposed within the first dielectric layer and contacts the source doping region. A second contact plug is disposed within the first dielectric layer and contacts the drain doping region. A first metal layer is disposed within the second dielectric layer and contacts the first contact plug. A second metal layer is disposed within the second dielectric layer and contacts the second contact plug. A trench is disposed on the gate structure and within the first dielectric layer and the second dielectric layer, wherein a width of the trench within the second dielectric layer is smaller than a width of the trench within the first dielectric layer. A filling layer is disposed within the trench and covers a top surface of the second dielectric layer. An air gap is disposed within the trench.

According to another preferred embodiment of the present invention, a fabricating method of a transistor structure with an air gap includes providing a substrate, wherein a transistor is disposed on the substrate, the transistor includes a gate structure disposed on the substrate, a source doping region and a drain doping region respectively embedded in the substrate at two side of the gate structure, an etching stop layer covering and contacting the transistor and the substrate, a first dielectric layer covering and contacting the etching stop layer, a second dielectric layer covering the first dielectric layer. Next, a dry etching process is performed to etch the first dielectric layer and the second dielectric layer to form a trench by taking the etching stop layer on the gate structure as a stop layer, wherein a width of the trench within the second dielectric layer is smaller than a width of the trench within the first dielectric layer. Finally, a filling layer is formed to fill in the trench and seal an opening of the trench to form an air gap within the trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict a fabricating method of a transistor structure with an air gap according to a preferred embodiment of the present invention, wherein:

FIG. 1 depicts a substrate with a transistor thereon;
FIG. 2 is in continuous from FIG. 1;
FIG. 3 is in continuous from FIG. 2;
FIG. 4 is in continuous from FIG. 3;
and
FIG. 5 is in continuous from FIG. 4.
FIG. 8 to FIG. 9 depict a fabricating method of a transistor structure with an air gap according to another preferred embodiment of the present invention, wherein:

FIG. 8 depicts a substrate with a trench thereon;
and
FIG. 9 is in continuous from FIG. 8.

DETAILED DESCRIPTION

FIG. 1 to FIG. 5 depict a fabricating method of a transistor structure with an air gap according to a preferred embodiment of the present invention.

Figure 1:
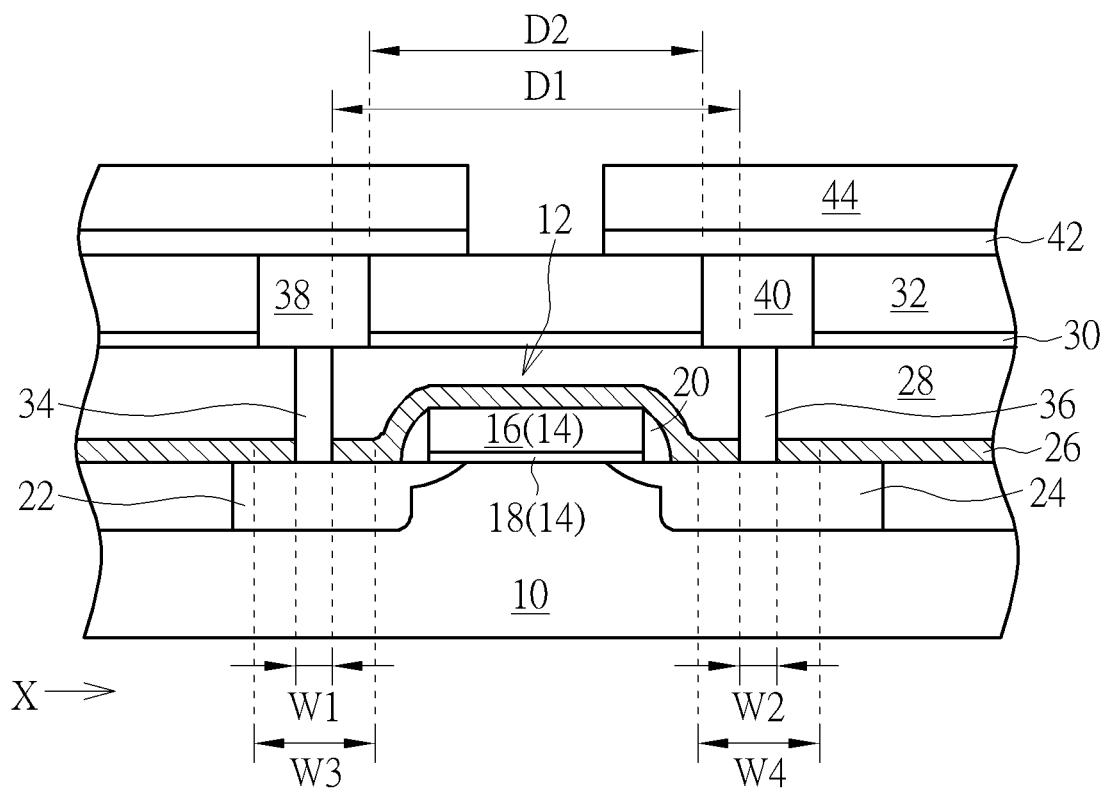

As shown in FIG. 1, a substrate 10 is provided. A transistor 12 is disposed on the substrate 10. The transistor 12 includes a gate structure 14 disposed on the substrate 10. The gate structure 14 includes a gate 16 and a gate dielectric layer 18. The gate dielectric layer 18 is disposed between the substrate 10 and the gate 16. A spacer 20 surrounds the gate structure 14. A source doping region 22 and a drain doping region 24 are respectively embedded in the substrate 10 at two side of the gate structure 14. An etching stop layer 26 conformally covers and contacts the transistor 12 and the substrate 10. A first dielectric layer 28 conformally covers and contacts the etching stop layer 26. A dielectric layer 30 can be formed optionally. A second dielectric layer 32 covers the first dielectric layer 28. Because the dielectric layer 30 is formed optionally, if there is the dielectric layer 30, the dielectric layer 30 is located between the first dielectric layer 28 and the second dielectric layer 32. This embodiment will be illustrated with the dielectric layer 30 as an example. A horizontal direction X is defined as a direction which parallel to a top surface of the substrate 10.

A first contact plug 34 is disposed within the first dielectric layer 28 and the etching stop layer 26 and contacts the source doping region 22. A second contact plug 36 is disposed within the first dielectric layer 28 and the etching stop layer 26 and contacts the drain doping region 24. A first metal layer 38 is disposed within the second dielectric layer 32 and contacts the first contact plug 34. A second metal layer 40 is disposed within the second dielectric layer 32 and contacts the second contact plug 36. A width W1 of the first contact plug 34 and a width W2 of the second contact plug 36 are both smaller than a width W3 of the first metal layer 38 and smaller than a width W4 of the second metal layer 40. The widths W1/W2/W3/W4 are all parallel to the horizontal direction X. A first shortest distance D1 is disposed between the first contact plug 34 and the second contact plug 36 along the horizontal direction X, a second shortest distance D2 is disposed between the first metal layer 38 and the second metal layer 40 along the horizontal direction X. Because the widths of the contact plugs and the metal layers are different, the second shortest distance D2 is smaller than the first shortest distance D1. That is, the space between the first metal layer 38 and the second metal layer 40 is smaller than the space between the first contact plug 34 and the second contact plug 36.

Next, a hard mask 42 and a photoresist 44 are formed on the second dielectric layer 32. Then, the photoresist 44 is patterned in order to transform the positions of trenches which will be formed afterwards onto the photoresist 44. Later, the hard mask 42 is etched by taking the photoresist 44 as a mask to transform the patterns on the photoresist to the hard mask 42.

Figure 2:
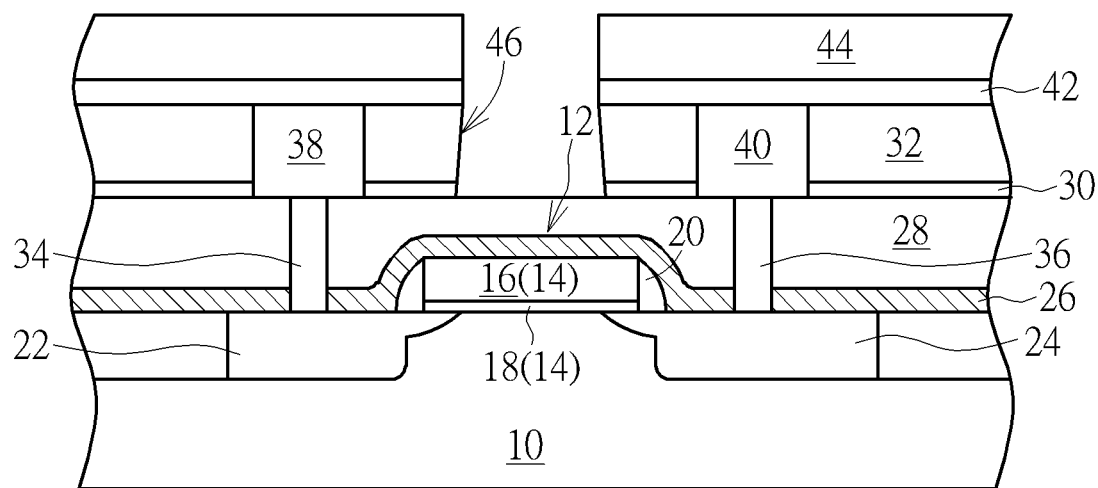
Figure 3:
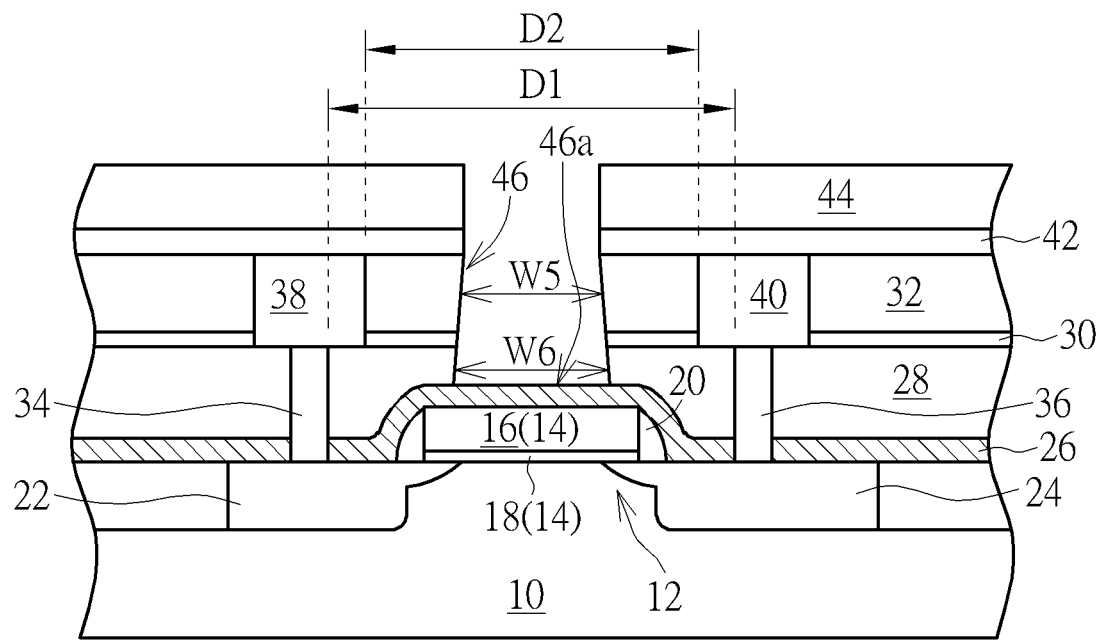

As shown in FIG. 2 and FIG. 3, an anisotropic etching such as a dry etching process is performed by taking the hard mask 42 as a mask. The dry etching process includes the steps of etching the second dielectric layer 32, the dielectric layer 30 and the first dielectric layer 28 by taking the etching stop layer 26 as a stop layer. More specifically speaking, in the steps shown in FIG. 2, the second dielectric layer 32 is dry etched until the etching gas touches the dielectric layer 30, and the etching gas is changed to continue to etch the dielectric layer 30 until the first dielectric layer 28 is exposed.

After that, as shown in FIG. 3, the etching gas is changed again to etch the first dielectric layer 28 by taking the etching stop layer 26 on the gate structure 14 as a stop layer. That is, the dry etching process is carried on until exposing the etching stop layer 26. Now, a trench 46 is formed within the second dielectric layer 32, the dielectric layer 30 and the first dielectric layer 28. The etching stop layer 26 serves as a bottom 46a of the trench 46. It is noteworthy that a width W5 of the trench 46 within the second dielectric layer 32 is smaller than a width W6 of the trench 46 within the first dielectric layer 28. The widths W5/W6 are parallel to the horizontal direction X. During the dry etching process mentioned above, the flow rates of each of compositions in the etching gas can be adjusted to make the etching rate of the second dielectric layer 32 along the horizontal direction X is smaller than the etching rate of the first dielectric layer 28 along the horizontal direction X with respective of the etching gas. In this way, the trench 46 can be formed with a big-end-down shape. As described above, the second shortest distance D2 is smaller than the first shortest distance D1; therefore, the shape of the trench 46 should go together with the size of the second shortest distance D2 and the first shortest distance D1. The width of the trench 46 can be altered based on different product requirements. However, the width of the trench 46 should not be extremely enlarged to expose the first metal layer 38, the second metal layer 40, the first contact plug 34 and the second contact plug 36 from the sidewall of the trench 46. If the first metal layer 38, the second metal layer 40, the first contact plug 34 and the second contact plug 36 are exposed from the sidewall of the trench 46, the first metal layer 38, the second metal layer 40, the first contact plug 34 and the second contact plug 36 will be etched by etching gas, and the conductivity will be deteriorated. In other words, during the dry etching process, the width of the trench 46 must follow the limitation that the width W5 of the trench 46 within the second dielectric layer 32 is smaller than the second shortest distance D2, and the width W6 of the trench 46 within the first dielectric layer 28 is smaller than the first shortest distance D1.

For instance, when drying etching the second dielectric layer 32, the etching gas can be a mixture gas of $O_2$, $C_5F_8$, CO and Ar, when drying etching the first dielectric layer 28, the etching gas can also be a mixture gas of $O_2$, $C_5F_8$, CO and Ar, but with a smaller flow rate of $O_2$ comparing to the flow rate of $O_2$ used in etching the second dielectric layer 32. In other words, the concentration of $O_2$ used in etching the first dielectric layer 28 is lower that the concentration of $O_2$ used in etching the second dielectric layer 32. Furthermore, in order to increase the etching rate along the horizontal direction X, an over etching is performed to enlarge the width of trench 26 within the first dielectric layer 28 while the etching process reaching the etching stop layer 26.

Figure 4:
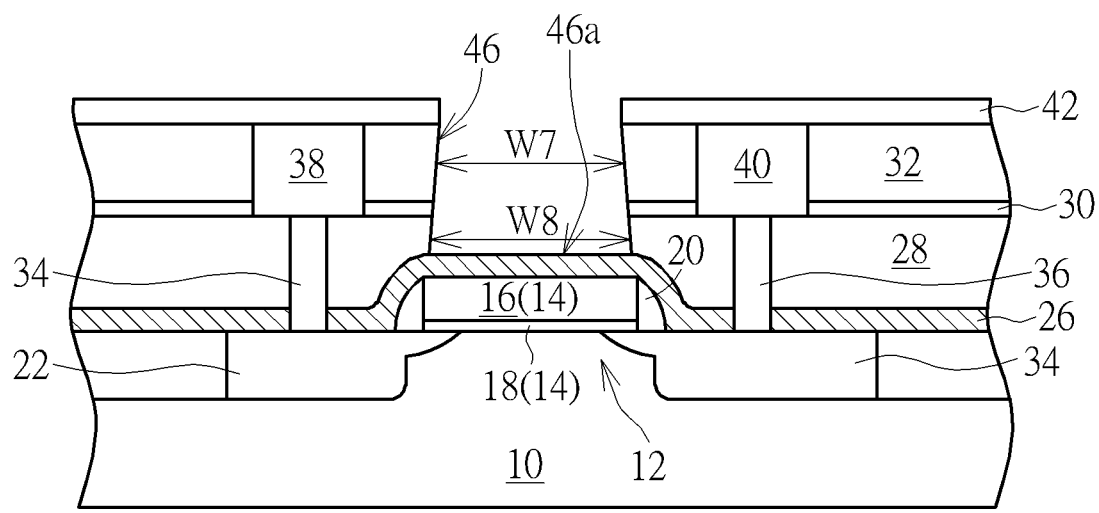

As shown in FIG. 4, the photoresist 44 is removed. After forming the trench 46, a cleaning process can be performed to remove the etching residue. During the cleaning process, the first dielectric layer 28 and the second dielectric layer 32 are partly removed by cleaning solution, and a removing rate of the second dielectric layer 32 is smaller than a removing rate of the first dielectric layer 28. The cleaning solution can remove the first dielectric layer 28 and the second dielectric layer 32; therefore the width difference between the trench 46 within the first dielectric layer 28 and within the second dielectric layer 32 is increased. The cleaning solution can be a mixture of HF, $NH_4F$ and water. After the cleaning process, the width W5 of the trench 46 within the second dielectric layer 32 is increased to a width W7. The width W6 of the trench 46 within the first dielectric layer 28 is increased to a width W8. But the width W7 and the width W8 still follow the limitations that the width W7 within the second dielectric layer 32 is smaller than the width W8 within the first dielectric layer 26, the width W7 is smaller than the second shortest distance D2 and the width W8 is smaller than the first shortest distance D1.

Figure 5:
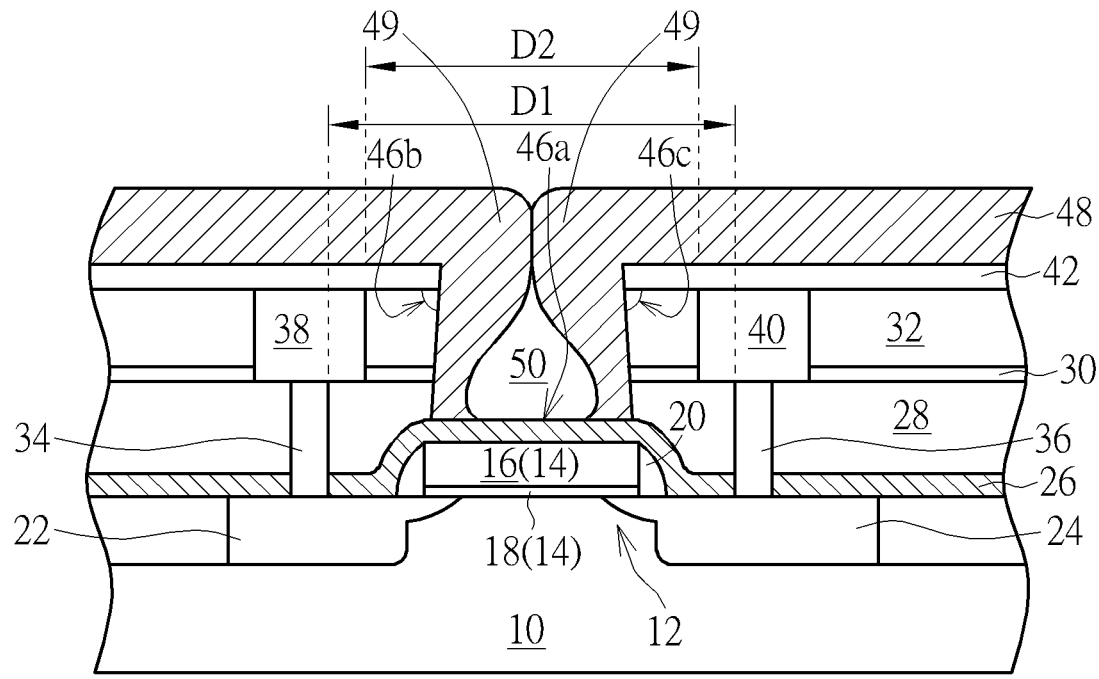

As shown in FIG. 5, a filling layer 48 is formed to fill in the trench 46 and seal an opening of the trench 46 to form an air gap 50 within the filling layer 48. A sidewall of the trench 46 and a top surface of the second dielectric layer 32 form a corner 46b and a corner 46c. A formation rate of the filling layer 48 at a bottom 46a of the trench 46 is smaller than a formation rate of the filling layer 48 at the corner 46b. Therefore, the filling layer 48 bulges out around the corner 46b and the corner 46c to form two overhangs 49. Furthermore, the filling layer 48 shrinks gradually from the two overhangs 49 toward the bottom 46a of the trench 46, and the two overhangs 49 contact each other. According to a preferred embodiment of the present invention, the filling layer 48 can be formed by a plasma enhanced chemical vapor deposition (PECVD) or a high density plasma chemical vapor deposition (HDP CVD), but not limited to them. Any fabricating process which can make the formation rate of the filling layer 48 at a bottom 46a of the trench 46 smaller than the formation rate of the filling layer 48 at the corner 46b can be used to form the filling layer 48.

Figure 6:
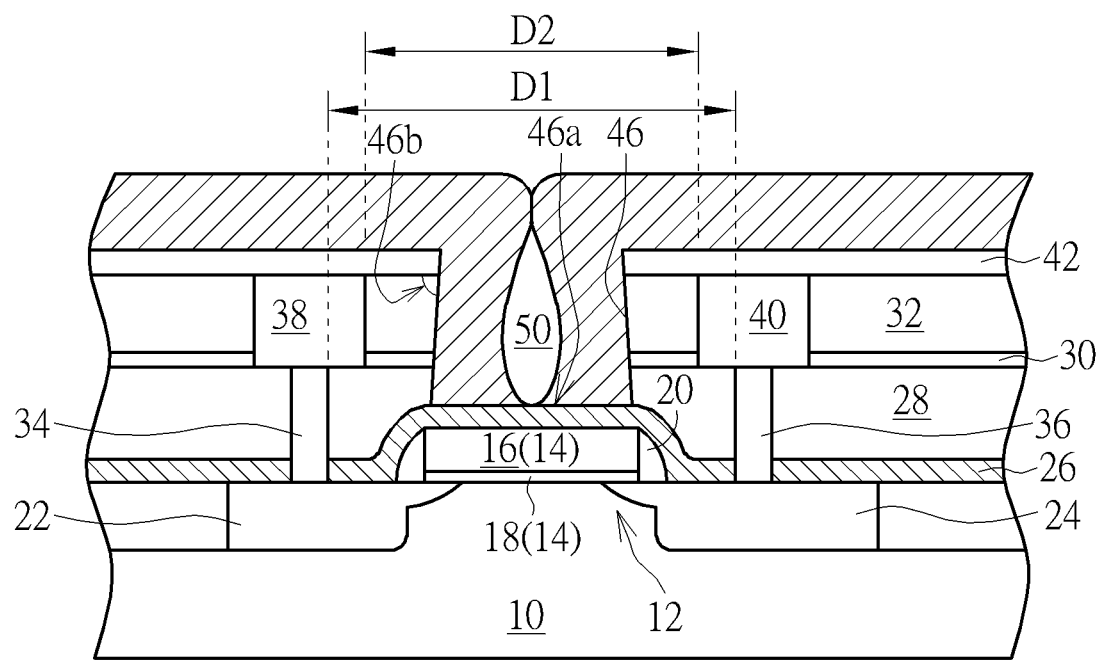
FIG. 6 depicts a transistor structure with an air gap according to a preferred embodiment of the present invention.
Figure 7:
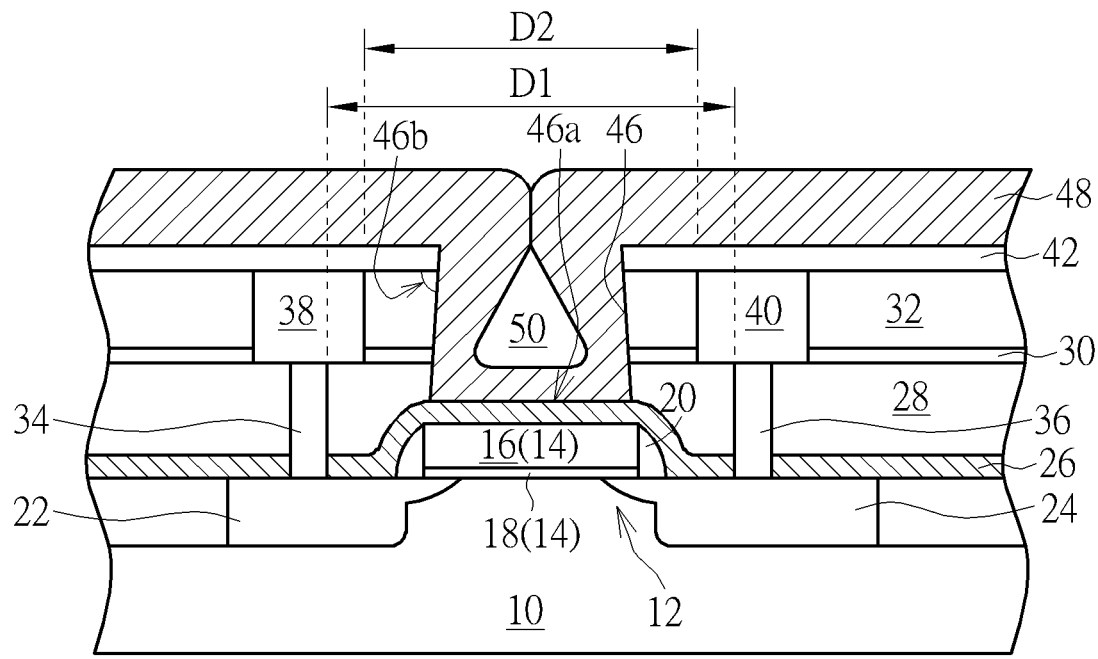
FIG. 7 depicts a transistor structure with an air gap according to another preferred embodiment of the present invention.

Please still refer to FIG. 5, part of the bottom 46a of the trench 46 can be not contacted by the filling layer 48. That is, the etching stop layer 26 on the gate structure 12 is not contacted by the filling layer 48. However, by adjusting the deposition condition, the bottom 46a of the trench 46 can be entirely contacted by the filling layer 48. Furthermore, the shape of the air gap 50 can be altered by modulating the deposition condition. For example, the air gap 50 shown in FIG. 5 is in a shape of a bell. The air gap 50 shown in FIG. 6 is in a shape of a droplet. The air gap 50 shown in FIG. 7 is in a shape of a triangle.

Figure 8:
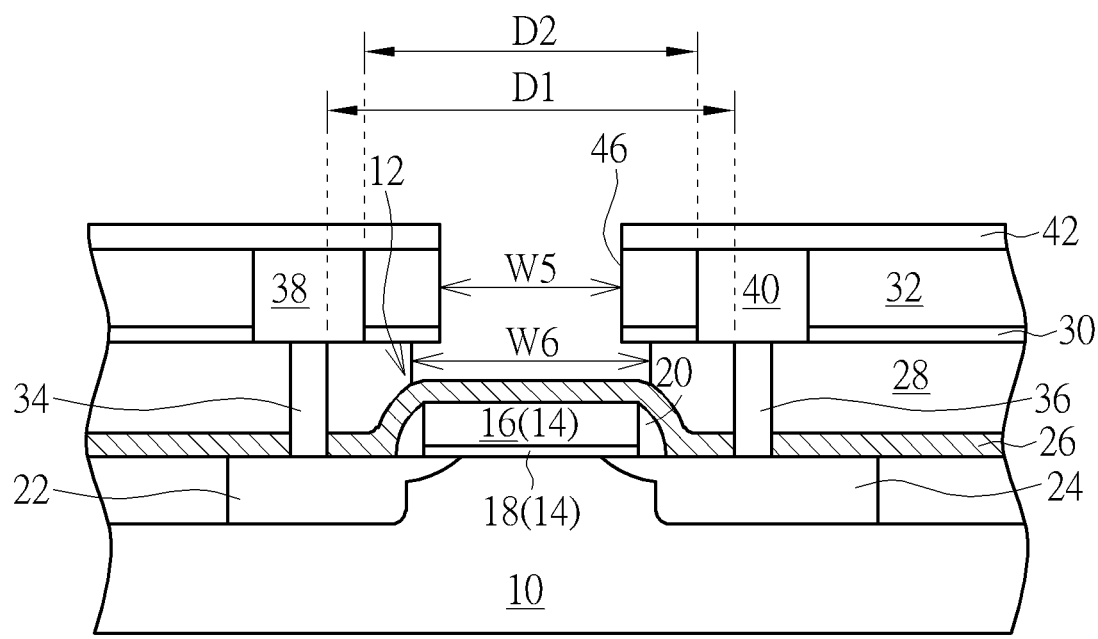
Figure 9:
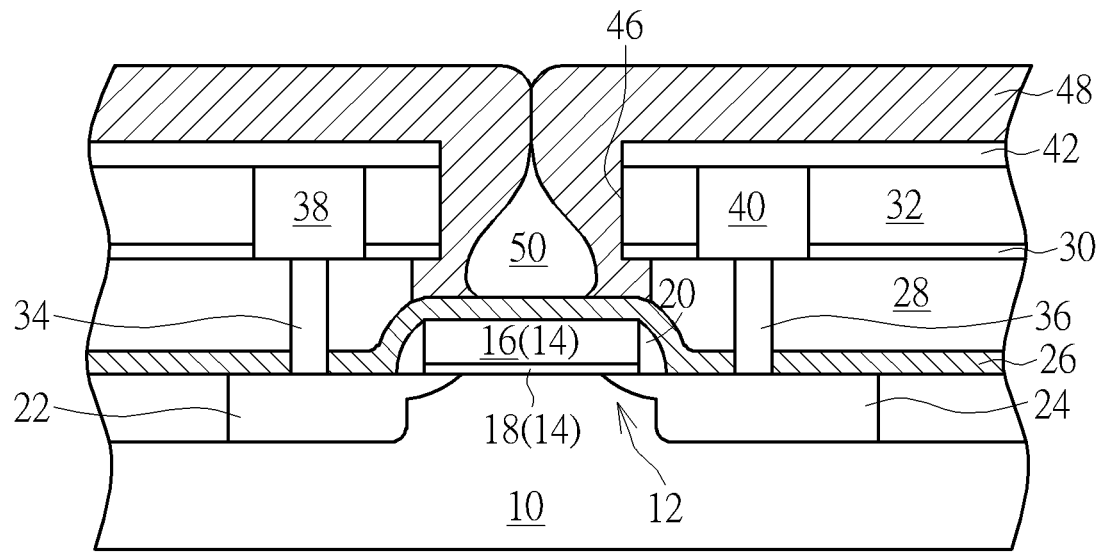
Figure 11:
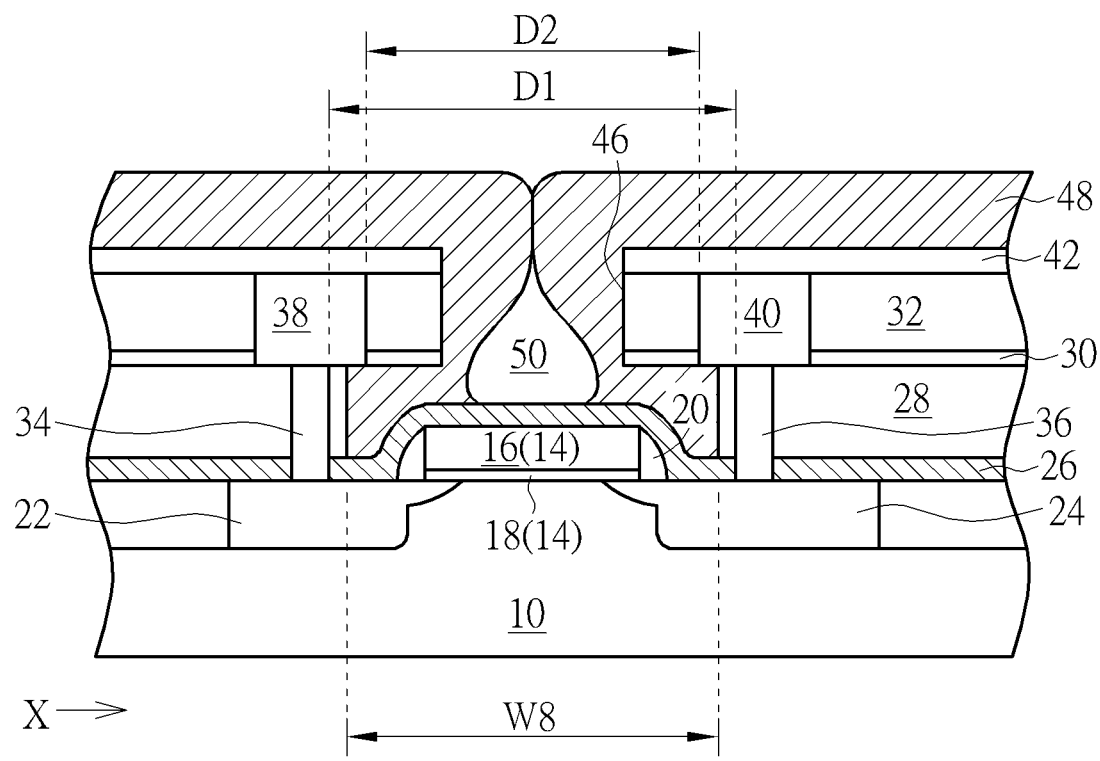
FIG. 11 depicts a varied type of FIG. 9.

FIG. 8 to FIG. 9 depict a fabricating method of a transistor structure with an air gap according to another preferred embodiment of the present invention, wherein elements which are substantially the same as those in the embodiment of FIG. 1 to FIG. 5 are denoted by the same reference numerals; an accompanying explanation is therefore omitted. The trench 46 shown in FIG. 2 to FIG. 3 has a tapered sidewall. But in this embodiment, as show in FIG. 8, the trench 46 has a vertical sidewall after dry etching the second dielectric layer 32, the dielectric layer 30 and the first dielectric layer 28. Similarly, the etching gas is adjusted to make the width W5 of the trench 46 in the second dielectric layer 32 smaller than the width W6 of the trench 46 with in the first dielectric layer 28. In this way, the trench 46 in FIG. 8 has a reversed-T shape. Next, as shown in FIG. 9, the filling layer 48 is formed to fill in the trench 46 and seal the opening 46 of the trench 46 to form the air gap 50 within the filling layer 46. The air gap 50 can be in a shape of a bell, in a shape of a droplet as shown in FIG. 6 or in a shape of a triangle as shown in FIG. 7. Furthermore, the filling layer 48 can partly cover the etching stop layer 26 on the gate structure 14. Alternatively, the filling layer 48 can cover the etching stop layer 26 on the gate structure 14 entirely. FIG. 11 depicts a varied type of FIG. 9, wherein elements which are substantially the same as those in the embodiment of FIG. 1 and FIG. 4 are denoted by the same reference numerals; an accompanying explanation is therefore omitted. The differences between FIG. 9 and FIG. 11 is that a width W8 of the trench 46 within the first dielectric layer 28 is greater than the second shortest distance D2 and smaller than the first shortest distance D1. By enlarging the trench 46 to its limitation, the air gap 50 closer to the gate structure 14 has a greater width to further decrease the capacitance between the gate structure 14 and contact plugs.

A transistor structure with an air gap is provided in the present invention. As show in FIG. 5, a transistor structure with an air gap 50 includes a substrate 10. A horizontal direction X is parallel to the top surface of the substrate 10. The substrate 10 includes a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. A transistor 12 is disposed on the substrate 10. The transistor 12 includes a gate structure 14 disposed on the substrate 10. A source doping region 22 and a drain doping region 24 are respectively embedded in the substrate 10 at two side of the gate structure 14. A spacer 20 surrounds the gate structure 14. An etching stop layer 26 conformally covers and contacts the transistor 12 and the substrate 10. A first dielectric layer 28 conformally covers and contacts the etching stop layer 26. A dielectric layer 30 conformally covers and contacts the first dielectric layer 28. A second dielectric layer 32 covers the first dielectric layer 28. The first dielectric layer 28 and the second dielectric layer 32 are formed by different materials. According to a preferred embodiment of the present invention, the first dielectric layer 28 can be undoped silicon oxide formed by a deposition process using tetraethyl orthosilicate (TEOS) as reacting gas. The second dielectric layer 32 is preferably fluorosilicate glass (FSG). The dielectric layer 30 is preferably silicon oxynitride. However, the first dielectric layer 28, the second dielectric layer 32, the dielectric layer 30 and the etching stop layer 26 are not limited to the examples described above. The first dielectric layer 28, the second dielectric layer 32, the dielectric layer 30 can respectively include insulating materials such as silicon oxide, silicon nitride, silicon carbide nitride, silicon oxynitride or silicon carboxynitride.

A first contact plug 34 is disposed within the first dielectric layer 28 contacts the source doping region 22. A second contact plug 36 is disposed within the first dielectric layer 28 and contacts the drain doping region 24. A first metal layer 38 is disposed within the second dielectric layer 32 and contacts the first contact plug 34. A second metal layer 40 is disposed within the second dielectric layer 32 and contacts the second contact plug 36. A first shortest distance D1 is disposed between the first contact plug 34 and the second contact plug 36 along the horizontal direction X. A second shortest distance D2 is disposed between the first metal layer 38 and the second metal layer 40 along the horizontal direction X. The second shortest distance D2 is smaller than the first shortest distance D1. The first contact plug 34, the second contact plug 36, the first metal layer 38 and the second metal layer 40 can respectively include Al, Ti, Ta, W, Cu, TiN, TiC, TaN, Ti/W, Ti/TiN or other conductive material, but not limited to them.

A trench 46 is disposed on the gate structure 46, overlaps the gate structure 14 and is within the first dielectric layer 28 and the second dielectric layer 32. More specifically speaking, the trench 46 is located between the first contact plug 34 and the second contact plug 36 and is directly on the gate structure 14. The width W7 within the second dielectric layer 32 is smaller than the width W8 within the first dielectric layer 26. Please refer to FIG. 4 for the positions of the widths W7/W8. The widths W7/W8 are parallel to the horizontal direction X. The bottom 46a of the trench 46 is formed by the etching stop layer 26. The width W7 of the trench 46 in the second dielectric layer 32 is smaller than the second shortest distance D2. The width W8 of the trench 46 in the first dielectric layer 28 is smaller than the first shortest distance D1. A filling layer 48 is disposed within the trench 46 and covers the top surface of the second dielectric layer 32. An air gap 50 is disposed within the filling layer 48. The filling layer 48 includes insulating materials such as silicon oxide, silicon nitride, silicon carbide nitride, silicon oxynitride or silicon carboxynitride. It is noteworthy that a width of the air gap 50 which is closer to the gate structure 14 is greater than a width of the air gap 50 which is farther from the gate structure 14. The width of the air gap 50 is parallel to the horizontal direction X. The air gap 50 shown in FIG. 5 is in a shape of a bell, but not limited to it. According to another preferred embodiment of the present invention, the width of the air gap 50 can be adjusted to become the width of the air gap 50 closer to the gate structure 14 smaller than a width of the air gap 50 farther from the gate structure 14 as shown in FIG. 6. In FIG. 6, the air gap 50 is in a shape of a droplet, but not limited to it.

Please refer to FIG. 5, a sidewall of the trench 46 and a top surface of the second dielectric layer 32 form a corner 46b. A thickness of the filling layer 48 at a bottom 46a of the trench 46 is smaller than a thickness of the filling layer 48 at the corner 46b. Moreover, the air gap 50 is disposed between the first contact plug 34 and the second contact plug 36, and the air gap 50 is disposed directly on the gate structure 14. According to a preferred embodiment of the present invention, the corner 46b is smaller than 90 degrees due to the big-end-down shape of the trench 46 which is formed with the width W7 within the second dielectric layer 32 being smaller than the width W8 within the first dielectric layer 26. Please refer to FIG. 4 for the position of the widths W7/W8.

Figure 10:
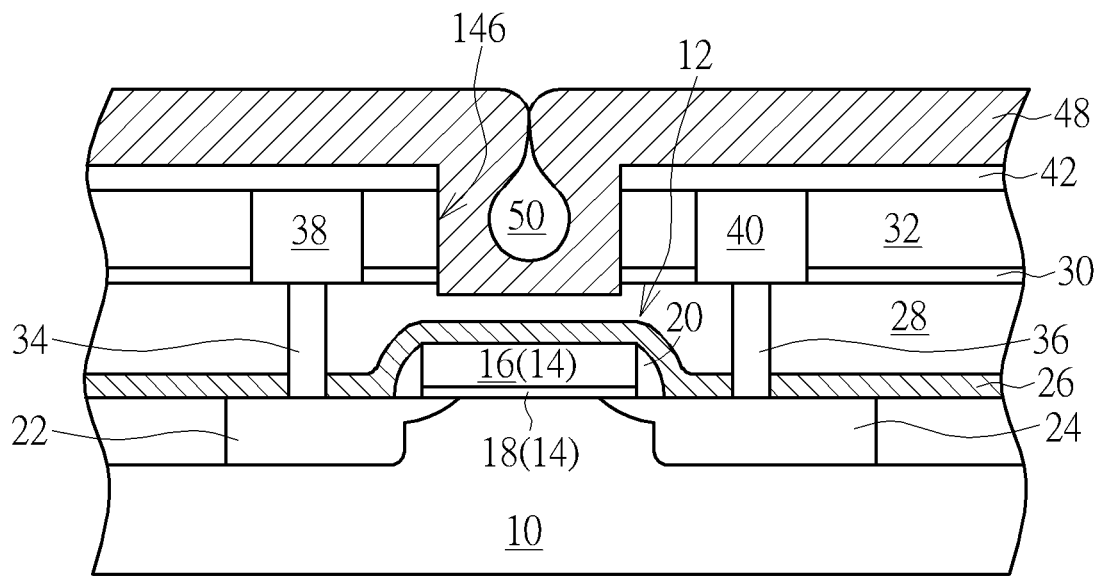
FIG. 10 depicts a transistor structure with an air gap according to an example of the present invention.

FIG. 10 depicts a transistor structure with an air gap according to an example of the present invention, wherein elements which are substantially the same as those in the embodiment of FIG. 5 are denoted by the same reference numerals; an accompanying explanation is therefore omitted. As shown in FIG. 10, the trench 146 in FIG. 10 takes the first dielectric layer 28 as a bottom of the trench 146, therefore the air gap 50 is located farther from the gate structure 14 comparing to the air gap 50 in FIG. 5. In this way, the air gap 50 in FIG. 10 does not provide much help to prevent the parasitic capacitance between the gate structure 14 and the first contact plug 34 and the parasitic capacitance between the gate structure 14 and the second contact plug 36.

On the other hand, the trench 46 in FIG. 5 is etched by taking the etching stop layer 26 which contacts the gate structure 14 as a stop layer. Therefore, the air gap 50 can be formed closed to the gate structure 14. In this way, the parasitic capacitance between the gate structure 14 and the first contact plug 34, the parasitic capacitance between the gate structure 14 and the second contact plug 36, the parasitic capacitance between the gate structure 14 and the first metal layer 38 and the parasitic capacitance between the gate structure 14 and the second metal layer 40 can be all decreased effectively. Moreover, the air gap 50 in the second dielectric layer 32 can lower the parasitic capacitance between the first metal layer 38 and the second metal layer 40. In addition, the trench 46 in FIG. 5 is specially widen to make the air gap 50 closer to the gate structure 14 has a greater width to further decrease the capacitance between the gate structure 14 and contact plugs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor structure with an air gap, comprising:
  a substrate;
  a transistor disposed on the substrate, wherein the transistor comprises:
    a gate structure disposed on the substrate; and
    a source doping region and a drain doping region respectively embedded in the substrate at two sides of the gate structure;
  an etching stop layer covering and contacting the transistor and the substrate, wherein the etching stop layer is a single material layer;
  a first dielectric layer covering and contacting the etching stop layer;
  a second dielectric layer covering the first dielectric layer;
  a first contact plug disposed within the first dielectric layer and contacting the source doping region;
  a second contact plug disposed within the first dielectric layer and contacting the drain doping region;
  a first metal layer disposed within the second dielectric layer and contacting the first contact plug;
  a second metal layer disposed within the second dielectric layer and contacting the second contact plug;
  a trench disposed on the gate structure and within the first dielectric layer and the second dielectric layer, wherein a width of the trench within the second dielectric layer is smaller than a width of the trench within the first dielectric layer, the etching stop layer serves as a bottom of the trench, and a sidewall of the trench and a top surface of the second dielectric layer form a first corner, and another sidewall of the trench and the top surface of the second dielectric layer form a second corner;
  a filling layer disposed within the trench and covering the top surface of the second dielectric layer, wherein the filling layer bulges out around the first corner and the second corner to form two overhangs, the filling layer shrinks gradually from the two overhangs toward the bottom of the trench, and the two overhangs contact each other; and
  an air gap disposed within the filling layer.

2. The transistor structure with the air gap of claim 1, wherein a width of the air gap which is closer to the gate structure is greater than a width of the air gap which is farther from the gate structure.

3. The transistor structure with the air gap of claim 1, wherein the air gap is in a shape of a bell, a droplet or a triangle.

4. The transistor structure with the air gap of claim 1, wherein a first shortest distance is disposed between the first contact plug and the second contact plug along a horizontal direction, a second shortest distance is disposed between the first metal layer and the second metal layer along the horizontal direction, the second shortest distance is smaller than the first shortest distance, and the horizontal direction is parallel to a top surface of the substrate.

5. The transistor structure with the air gap of claim 4, wherein the width of the trench within the second dielectric layer is smaller than the second shortest distance, and the width of the trench within the first dielectric layer is smaller than the first shortest distance.

6. The transistor structure with the air gap of claim 1, wherein a thickness of the filling layer at the bottom of the trench is smaller than a thickness of the filling layer at the first corner.

7. The transistor structure with the air gap of claim 1, wherein the first dielectric layer and the second dielectric layer are made of different materials.

8. The transistor structure with the air gap of claim 1, wherein the air gap is disposed between the first contact plug and the second contact plug, and the air gap is disposed directly on the gate structure.

9. A fabricating method of a transistor structure with an air gap, comprising:
  providing a substrate, wherein a transistor is disposed on the substrate, the transistor comprises a gate structure disposed on the substrate, a source doping region and a drain doping region respectively embedded in the substrate at two sides of the gate structure, an etching stop layer covering and contacting the transistor and the substrate, a first dielectric layer covering and contacting the etching stop layer, a second dielectric layer covering the first dielectric layer, and wherein the etching stop layer is a single material layer;

performing a dry etching process to etch the first dielectric layer and the second dielectric layer to form a trench by taking the etching stop layer on the gate structure as a stop layer, wherein a width of the trench within the second dielectric layer is smaller than a width of the trench within the first dielectric layer, the etching stop layer serves as a bottom of the trench, and a sidewall of the trench and a top surface of the second dielectric layer form a first corner, and another sidewall of the trench and the top surface of the second dielectric layer form a second corner; and forming a filling layer filling in the trench and sealing an opening of the trench to form an air gap within the filling layer, wherein the filling layer bulges out around the first corner and the second corner to form two overhangs, the filling layer shrinks gradually from the two overhangs toward the bottom of the trench, and the two overhangs contact each other.

10. The fabricating method of the transistor structure with the air gap of claim 9, wherein the width of the trench in the second dielectric layer is made to be smaller than the width of the trench in the first dielectric layer by adjusting a flow rate of etching gas during the dry etching process.

11. The fabricating method of the transistor structure with the air gap of claim 9, further comprising after the dry etching process and forming of the filling layer, performing a cleaning process, wherein during the cleaning process, the first dielectric layer and the second dielectric layer are partly removed by cleaning solution, and a removing rate of the second dielectric layer is smaller than a removing rate of the first dielectric layer with respective to the cleaning solution.

12. The fabricating method of the transistor structure with the air gap of claim 9, further comprising:

a first contact plug disposed within the first dielectric layer and contacting the source doping region;

a second contact plug disposed within the first dielectric layer and contacting the drain doping region;

a first metal layer disposed within the second dielectric layer and contacting the first contact plug; and a second metal layer disposed within the second dielectric layer and contacting the second contact plug.

13. The fabricating method of the transistor structure with the air gap of claim 12, wherein the air gap is disposed between the first contact plug and the second contact plug, and the air gap is disposed directly on the gate structure.

14. The fabricating method of the transistor structure with the air gap of claim 12, wherein a first shortest distance is disposed between the first contact plug and the second contact plug along a horizontal direction, a second shortest distance is disposed between the first metal layer and the second metal layer along the horizontal direction, the second shortest distance is smaller than the first shortest distance, and the horizontal direction is parallel to a top surface of the substrate.

15. The fabricating method of the transistor structure with the air gap of claim 14, wherein the width of the trench within the second dielectric layer is smaller than the second shortest distance, and the width of the trench within the first dielectric layer is smaller than the first shortest distance.

16. The fabricating method of the transistor structure with the air gap of claim 9, wherein a formation rate of the filling layer at the bottom of the trench is smaller than a formation rate of the filling layer at the first corner.

17. The fabricating method of the transistor structure with the air gap of claim 9, wherein the fabricating steps of the filling layer comprise a plasma enhance chemical vapor deposition or a high density plasma chemical vapor deposition.

18. The fabricating method of the transistor structure with the air gap of claim 9, wherein the air gap is in a shape of a bell, a droplet or a triangle.

* * * * *